(12) United States Patent
Levy et al.

(10) Patent No.: US 12,514,051 B2
(45) Date of Patent: Dec. 30, 2025

(54) PROCESS FOR MANUFACTURING A THREE-DIMENSIONAL LED-BASED EMISSIVE DISPLAY SCREEN

(71) Applicant: Commissariat à l'Énergie Atomique et aux Énergies Alternatives, Paris (FR)

(72) Inventors: François Levy, Grenoble (FR); Bernard Aventurier, Grenoble (FR); Yohan Desieres, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 877 days.

(21) Appl. No.: 17/440,344

(22) PCT Filed: Mar. 27, 2020

(86) PCT No.: PCT/EP2020/058845
§ 371 (c)(1),
(2) Date: Sep. 17, 2021

(87) PCT Pub. No.: WO2020/201150
PCT Pub. Date: Oct. 8, 2020

(65) Prior Publication Data
US 2022/0190026 A1 Jun. 16, 2022

(30) Foreign Application Priority Data
Mar. 29, 2019 (FR) ...................................... 1903380

(51) Int. Cl.
*H10H 29/14* (2025.01)
*H10H 20/01* (2025.01)
(Continued)

(52) U.S. Cl.
CPC ........ *H10H 29/142* (2025.01); *H10H 20/833* (2025.01); *H10H 20/856* (2025.01);
(Continued)

(58) Field of Classification Search
None
See application file for complete search history.

(56) References Cited

U.S. PATENT DOCUMENTS 8,890,111 B2 * 11/2014 Templier ............... H01L 27/156
438/34
11,195,878 B2 * 12/2021 Pourquier
(Continued)

FOREIGN PATENT DOCUMENTS

CN 102201426 A 9/2011
EP 2 357 676 A1 8/2011
(Continued)

OTHER PUBLICATIONS

International Search Report and Written Opinion for International Application No. PCT/EP2020/058845, dated May 29, 2020.
(Continued)

*Primary Examiner* — Jack S Chen
(74) *Attorney, Agent, or Firm* — Wolf, Greenfield & Sacks, P.C.

(57) ABSTRACT

A method of manufacturing an emissive screen comprising LEDs, including the steps of: a) depositing a first metal layer on a surface of a control circuit; b) depositing a second metal layer on a surface of an optoelectronic circuit; c) bonding the optoelectronic circuit to the control circuit by direct bonding of the second metal layer to the first metal layer, by aligning the optoelectronic circuit with respect to the control circuit so that different emission cells of the optoelectronic circuit are arranged opposite different metal connection pads of the control circuit; and d) forming, from the surface of the optoelectronic circuit opposite to the control circuit, trenches laterally delimiting each emission cell.

17 Claims, 6 Drawing Sheets

(51) Int. Cl.
*H10H 20/833* (2025.01)
*H10H 20/856* (2025.01)
*H10H 20/857* (2025.01)

(52) U.S. Cl.
CPC ......... *H10H 20/857* (2025.01); *H10H 20/032* (2025.01); *H10H 20/0363* (2025.01); *H10H 20/0364* (2025.01)

(56) References Cited

U.S. PATENT DOCUMENTS

| | | |
|---|---|---|
| 11,322,655 B2 * | 5/2022 | Kopp |
| 2018/0351017 A1 | 12/2018 | Schneider, Jr. et al. |

FOREIGN PATENT DOCUMENTS

| | | | | |
|---|---|---|---|---|
| WO | WO 2011/048318 A1 | 4/2011 | | |
| WO | WO 2017/194845 A1 | 11/2017 | | |
| WO | WO-2019002786 A1 * | 1/2019 | ......... | H01L 25/0753 |
| WO | WO-2019025117 A1 * | 2/2019 | ......... | H01L 33/0093 |

OTHER PUBLICATIONS

Second Office Action for Chinese Application No. 202080027043.2, dated Feb. 29, 2024.
International Preliminary Report on Patentability for International Application No. PCT/EP2020/058845, mailed Oct. 14, 2021.
PCT/EP2020/058845, Oct. 14, 2021, International Preliminary Report on Patentability.

* cited by examiner

PROCESS FOR MANUFACTURING A THREE-DIMENSIONAL LED-BASED EMISSIVE DISPLAY SCREEN

This application is a national stage filing under 35 U.S.C. § 371 of International Patent Application Serial No. PCT/EP2020/058845, filed Mar. 27, 2020, which claims the priority benefit of French patent application number 19/0338, filed Mar. 29, 2019. The content of these applications are incorporated herein by reference in their entirety.

TECHNICAL BACKGROUND

The present disclosure generally relates to optoelectronic devices, and more particularly aims at the forming of an emissive display comprising light-emitting diodes (LED) comprising three-dimensional semiconductor elements, for example, of nanowire or microwire type.

PRIOR ART

Patent application WO2011/048318 describes a method of manufacturing an emissive screen with LEDs for which each pixel of the screen comprises a plurality of elementary LEDs each comprising a semiconductor nanowire, connected in parallel between two electrodes of an active control circuit of the screen.

A limitation of such a method is that the elementary LEDs of the different pixels of the screen are identical or similar, so that all the pixels of the screen emit an electromagnetic radiation at a same wavelength (i.e. all the screen pixels have an emission peak at a same wavelength). The screen is called monochromatic.

To form a polychromatic screen, also called color screen, that is, comprising pixels of different types capable of emitting electromagnetic radiations at different wavelengths (i.e. having emission peaks at different wavelengths), a possibility is to provide, in certain pixels of the screen, wavelength conversion elements capable of converting the electromagnetic radiation emitted by the pixel LEDs into an electromagnetic radiation at another wavelength. This however complicates the screen manufacturing, particularly when the pitch between pixels of the screen is small, and may further cause a decrease in its electro-optical conversion efficiency.

Patent application WO2019/002786 describes an example of a method of manufacturing a so-called direct emission color screen, that is, where the pixels of different types comprise LEDs of different natures, each LED directly emitting at the emission wavelength of the pixel, without using a wavelength conversion element. Each pixel of the screen formed by this method comprises a plurality of elementary LEDs each formed by a three-dimensional semiconductor element, for example, a semiconductor nanowire or microwire, connected in parallel between two electrodes of an active control circuit of the screen. In this screen, the active areas of the elementary LEDs of pixels of different types have different compositions, to obtain different emission wavelengths.

A limitation of this method is that it comprises a step of bonding a surface of an active control circuit comprising an alternation of metal regions and of dielectric regions, on a surface of an optoelectronic circuit comprising a corresponding pattern of alternated metal regions and dielectric regions. The bonding of the active control circuit to the optoelectronic circuit may be formed by hybrid direct bonding, that is, by direct metal-to-metal bonding of the metal regions of the active control circuit onto the corresponding metal regions of the optoelectronic circuit and by direct dielectric-to-dielectric bonding of the insulating regions of the active control circuit onto corresponding insulating regions of the optoelectronic circuit. The implementation of a hybrid direct bonding however requires a preparation of the surfaces to be assembled which is relatively difficult to implement. In particular, such a bonding implies respecting certain conditions relative to the coverage rate and the metal/insulator distribution of the surfaces to be assembled. This complicates the screen manufacturing since an additional metallization level, generally made of copper, aiming at respecting these conditions, should then be provided on the side of the active control circuit assembly surface and/or on the side of the optoelectronic circuit assembly surface.

It would be desirable to have a method of manufacturing a color display screen comprising direct emission LEDs comprising three-dimensional semiconductor elements, for example, of nanowire or microwire type, such a method overcoming all or part of the disadvantages of known methods of manufacturing such a screen.

SUMMARY

For this purpose, an embodiment provides a method of manufacturing an emissive screen comprising LEDs, comprising the steps of:
  a) depositing a first metal layer on a surface of a control circuit comprising a plurality of metal connection pads, the first metal layer extending all over the surface of the control circuit and being electrically connected to the metal connection pads of the control circuit;
  b) depositing a second metal layer on a surface of an optoelectronic circuit comprising first emission cells capable of emitting an electromagnetic radiation at a first wavelength and second emission cells capable of emitting an electromagnetic radiation at a second wavelength different from the first wavelength, each first emission cell comprising one or a plurality of LEDs, each formed of a three-dimensional semiconductor element, the second metal layer extending all over the surface of the optoelectronic circuit and being electrically connected to a first end of each three-dimensional semiconductor element of the optoelectronic circuit;
  c) bonding the optoelectronic circuit to the control circuit by direct bonding of the second metal layer to the first metal layer, by aligning the optoelectronic circuit with respect to the control circuit so that the different emission cells of the optoelectronic circuit are arranged opposite different metal connection pads of the control circuit; and
  d) forming, from the surface of the optoelectronic circuit opposite to the control circuit, trenches laterally delimiting each emission cell of the optoelectronic circuit, the trenches crossing the second and first metal layers so that the different elementary emission cells are connected to different metal connection pads of the control circuit.

According to an embodiment, each second emission cell comprises one or a plurality of LEDs, each formed of a three-dimensional element.

According to an embodiment, the second metal layer comprises at least one layer reflective for the electromagnetic radiation emitted by the first and second emission cells.

According to an embodiment, the reflective layer comprises silver or aluminum.

According to an embodiment, the first metal layer comprises a metal bonding layer in contact with a metal bonding layer of the second metal layer, the metal bonding layers of the first and second metal layers being made of the same material.

According to an embodiment, the metal bonding layers of the first and second metal layers are made of Ti, Ni, Pt, Sn, Au, Ag, Al, Pd, W, Pb, Cu, AuSn, TiSn, NiSn, or of an alloy of all or part of these materials.

According to an embodiment, the method further comprises the forming of lateral insulating walls in the trenches.

According to an embodiment, the lateral insulating walls are made of an electrically-insulating material.

According to an embodiment, the lateral insulating walls comprise an insulating layer coating the lateral walls and the bottom of the trenches, and a central conductive wall.

According to an embodiment, the central conductive wall is made of a reflective material, for example, aluminum or tungsten.

According to an embodiment:
the trenches have inclined lateral walls, and/or;
a reflector formed of an alternation of dielectric layers having different refraction indexes is formed on the lateral walls of the trenches.

According to an embodiment, the method further comprises a step of deposition of a transparent conductive layer on the surface of the optoelectronic circuit opposite to the control circuit, the transparent conductive layer being in contact with a second end of each three-dimensional semiconductor element of the optoelectronic circuit and forming an electrode common to all the emission cells of the optoelectronic circuit.

According to an embodiment, the transparent conductive layer is made of graphene or of a transparent conductive oxide.

According to an embodiment, the method further comprises forming a metallization electrically connecting the transparent conductive layer to one or a plurality of connection pads of the control circuit.

According to an embodiment, the transparent conductive layer is in contact, by its lower surface, with the upper surface of the central conductive walls of the lateral insulating walls.

According to an embodiment, the optoelectronic circuit further comprises third emission cells capable of emitting an electromagnetic radiation at a third wavelength different from the first and second wavelengths.

Another embodiment provides an emissive screen comprising LEDs, comprising:
a control circuit having a surface comprising a plurality of metal connection pads, a first metal layer extending over said surface of the control circuit and being electrically connected to the metal connection pads of the control circuit; and
an optoelectronic circuit comprising first emission cells capable of emitting an electromagnetic radiation at a first wavelength and second emission cells capable of emitting an electromagnetic radiation at a second wavelength different from the first wavelength, each first emission cell comprising one of a plurality of LEDs, each formed of a three-dimensional semiconductor element, a second metal layer extending over a surface of the optoelectronic circuit and being electrically connected to a first end of each three-dimensional semiconductor element of the optoelectronic circuit,
wherein the optoelectronic circuit is bonded to the control circuit by direct bonding of the second metal layer to the first metal layer, so that the different emission cells of the optoelectronic circuit are arranged opposite different metal connection pads of the control circuit, and wherein the screen comprises a plurality of trenches formed from the surface of the optoelectronic circuit opposite to the control circuit, the trenches laterally delimiting each emission cell of the optoelectronic circuit, the trenches crossing the second and first metal layers so that the different elementary emission cells are connected to different metal connection pads of the control circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
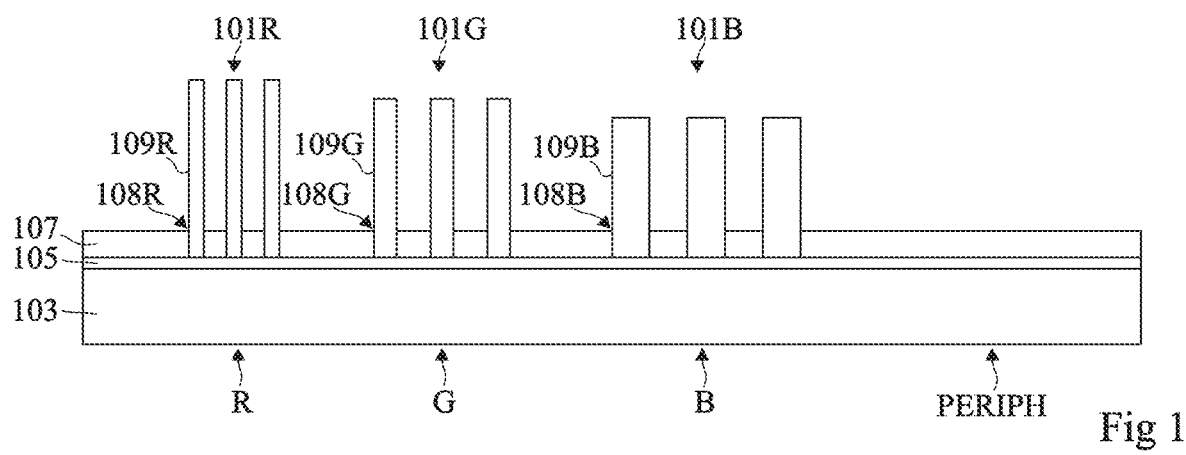
FIG. 1 illustrates a step of a first method of manufacturing an emissive display screen comprising LEDs according to an embodiment.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the circuits for controlling the LEDS of the described displays screens has not been detailed, the described embodiments being compatible with usual implementations of such control circuits. Further, the different epitaxial growth steps implemented to form the three-dimensional elementary LEDs of the described display screens has not been detailed, the described embodiments being compatible with known methods of forming such three-dimensional elementary LEDs, for example, the methods described in above-mentioned patent application WO2019/002786.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", "lateral", etc., or to terms qualifying directions, such as terms "horizontal", "vertical", etc., it is referred to the orientation of the drawings, it being understood that, in practice, the described structures may be oriented differently.

Unless specified otherwise, the expressions "around", "approximately", "substantially" and "in the order of" signify within 10%, and preferably within 5%.

The present application particularly concerns LED display screens comprising elementary LEDs, each formed of a three-dimensional semiconductor element, for example, of nanowire or microwire type. The term three-dimensional semiconductor element here designates an element elongated along a main direction called longitudinal direction. Such an element may have a wire shape, or also a conical or frustoconical shape, or a pyramidal shape. As an example, each three-dimensional semiconductor element has a maximum transverse dimension in the range from 5 nm to 2.5 µm, for example, from 50 nm to 1 µm, and a longitudinal dimension greater than or equal to 1 time, preferably greater than or equal to 5 times, its maximum transverse direction.

FIGS. 1 to 16 are partial simplified cross-section views of the structures obtained at steps of an example of a method of manufacturing an emissive display comprising LEDs according to an embodiment. The forming of a direct emission color display (with no wavelength conversion elements), comprising three-dimensional semiconductor elements, is more particularly considered herein. In this example, the display comprises three different pixel types, respectively designated in the drawings with references R, G, and B, capable of respectively emitting electromagnetic radiations at three different wavelengths, for example capable of respectively emitting red light, green light, and blue light. The described embodiments may however apply whatever the number of different pixel types of the screen, greater than or equal to two. In the drawings, only a red pixel R, a green pixel G, and a blue pixel B, have been shown. In practice, the screen may comprise a large number of pixels of each type, it being understood that the pixels of a same type are substantially identical (to within manufacturing dispersions). The pitch between pixels is for example smaller than 15 µm, preferably smaller than or equal to 5 µm. FIGS. 1 to 16 further show a portion of a peripheral portion PERIPH of the screen surrounding, in top view (not shown), all the R, G, and B screen pixels.

FIGS. 1 to 7 more particularly illustrate successive steps of manufacturing of an optoelectronic circuit comprising, for each R, G, and B pixel of the screen, an emission cell 101R, respectively 101G, respectively 101B, individually controllable to emit an electromagnetic radiation at the emission wavelength of the pixel. Each emission cell comprises one or a plurality of elementary LEDs connected in parallel, each formed of a three-dimensional semiconductor element of nanowire or microwire type. Each elementary LED is capable of emitting an electromagnetic radiation at the emission wavelength of the pixel to which it belongs. The longitudinal axes of all the three-dimensional elements of the screen are substantially parallel. In each emission cell, the elementary LEDs of the cell have substantially the same dimensions and are regularly distributed over the cell surface. The elementary LEDs of pixels of different types however have different transverse dimensions and/or the emission cells of pixels of different types have different spacings or pitches between LEDs.

FIG. 1 shows a structure obtained after the successive steps of:
depositing, on the upper surface of a support substrate 103, a nucleation layer 105 also called seed layer;
depositing on the upper surface of nucleation layer 105 an electrically-insulating layer 107;
forming in insulating layer 107 through openings 108R, 108G, and 108B to expose portions of nucleation layer 105 at the desired locations of the elementary LEDs of the screen;
simultaneously growing semiconductor wires 109R, 109G, and 109B from nucleation layer 105 opposite openings 108R, respectively 108G, respectively 108B.

Substrate 103 may be a monoblock structure or may correspond to a layer covering a support made of another material. Substrate 103 is for example made of a semiconductor material, for example, of silicon. As an example, substrate 103 is made of single-crystal silicon, the upper surface of substrate 103 for example having crystal orientation <111>. Substrate 103 may correspond to a multilayer structure of silicon-on-insulator type, also called SOI. As a variation, substrate 103 is a substrate made of germanium, of silicon carbide, of a III-V compound, such as GaN or GaAs, or a ZnO substrate, or a conductive substrate, for example, a substrate made of a metal or a metal alloy, particularly copper, titanium, molybdenum, a nickel-based alloy, and steel.

Nucleation layer 105 comprises one or a plurality of materials which favor the growth of the three-dimensional semiconductor elements forming the elementary LEDs of the optoelectronic circuit. As an example, layer 105 comprises a stack (not detailed in the drawing) of at least two layers of different materials, where each of the layers of the stack may be a metal, a metal oxide, a nitride, a carbide, or a boride of a transition metal of column IV, V, or VI of the periodic table of elements, or a combination of these compounds and preferably a nitride of a transition metal of column IV, V, or VI of the periodic table of elements or a combination of these compounds. As an example, each of the layers of stack 105 may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbo-nitride (TaCN), of magnesium nitride in $Mg_xN_y$ form, where x is approximately equal to 3 and y is approximately equal to 2, for example, magnesium nitride according to form $Mg_3N_2$. Each of the layers of stack 105 has, for example, a thickness in the range from 1 nm to 100 nm, preferably in the range from 10 nm to 30 nm.

Insulating layer 107 may be a single layer, or comprise a stack of a plurality of successive insulating layers made of different materials. As an example, layer 107 comprises a stack of two insulating layers (not detailed in the figures) made of different materials, each of the two layers of the stack being made of a material selected from the group comprising silicon oxide ($SiO_2$), silicon nitride ($Si_xN_y$, where x is approximately equal to 3 and y is approximately equal to 4, for example, $Si_3N_4$), silicon oxynitride (particularly of general formula $SiO_xN_y$, for example, $Si_2ON_2$), hafnium oxide (HfO$_2$), or aluminum oxide (Al$_2$O$_3$). As an example, the first layer or lower layer of stack 107 is made of silicon oxide and the second layer or upper layer of stack 107 is made of silicon nitride. The thickness of each insulating layer of stack 107 is for example in the range from 10 nm to 100 nm, preferably from 20 nm to 60 nm, for example, equal to approximately 40 nm.

In this example, openings 108R, respectively 108G, respectively 108B, are formed at the desired locations of the elementary LEDs of emission cells 101R, respectively 101G, respectively 101B. The lateral dimensions of openings 108R, respectively 108G, respectively 108B substantially correspond to the desired transverse directions of the three-dimensional semiconductor elements forming the elementary LEDs of the R, respectively G, respectively B pixels of the screen. Thus, in each emission cell 101R, respectively 101G, respectively 101B, the openings 108R, respectively 108G, respectively 108B of the cell substantially have the same dimensions and are regularly distributed over the cell surface. The openings 108R, 108G, 108B of pixels of different types however have different lateral dimensions and/or the emission cells of pixels of different types have different spacings or pitches between openings.

Each semiconductor wire 109R, 109G, 109B is for example a semiconductor material selected from the group comprising III-V compounds, II-VI compounds, or group-IV semiconductors or compounds. Each semiconductor wire 109R, 109G, 109B may be at least partly formed from a first semiconductor material mainly comprising a III-V compound, for example, a III-N compound, a II-VI compound, or at least one group-IV element. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions. Examples of group-IV semiconductor materials are silicon (Si), carbon (C), germanium (Ge), silicon carbide alloys (SiC), silicon-germanium alloys (SiGe), or germanium carbide alloys (GeC). The semiconductor material of wires 109R, 109G, and 109B may comprise a dopant, for example, silicon ensuring an N-type doping of a III-N compound, or magnesium ensuring a P-type doping of a III-N compound.

Each wire 109R, 109G, 109B may have a shape elongated along an axis substantially perpendicular to the upper surface of substrate 103, for example, a generally cylindrical shape. Each wire 109R, 109G, 109B may have a diameter, in cross-section, in the range from 5 nm to 2.5 µm, for example, from 50 nm to 1 µm. The longitudinal axes of two adjacent wires 109R, 109G, 109B may be distant by from 100 nm to 3 µm and preferably from 200 nm to 1.5 µm.

The height (longitudinal dimension) of each wire 109R, 109G, 109B at the end of the growth step may be in the range from 250 nm to 15 µm, preferably from 500 nm to 5 µm, more preferably from 1 µm to 3 µm. In this example, at the end of the growth step, wires 109R, 109G, 109B have different heights. The height of each wire 109R, 109G, and 109B particularly depends on the diameter of the wire and on the interval between wires (which themselves depend on the lateral dimensions of openings 108R, 108G, and 108B and of the distance between openings).

As an example, the method of forming wires 109R, 109G, and 109B may comprise injecting into a reactor a precursor of a group-III element and a precursor of a group-V element. Examples of group-III precursors are trimethylgallium (TMGa), triethylgallium (TEGa), trimethylindium (TMIn), or trimethylaluminum (TMAl). Examples of precursors of group-V elements are ammonia (NH$_3$), tertiarybutylphosphine (TBP), arsine (AsH$_3$), or dimethylhydrazine (UDMH).

The forming of the structure of FIG. 1 is for example identical or similar to that of the structure of FIG. 8A of the above-mentioned patent application WO2019/002786, incorporated herein by reference.

Figure 2:
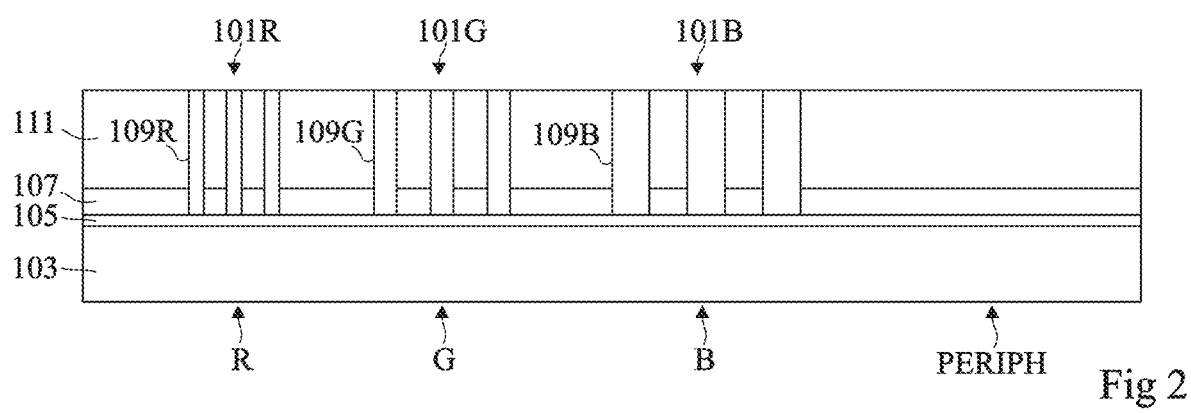
FIG. 2 illustrates another step of the first method.

FIG. 2 shows the structure obtained after the additional successive steps of:
 depositing a dielectric or polymer layer 111 all over the upper surface of the structure of FIG. 1, that is, over semiconductor wires 109R, 109G, and 109B and over the upper surface of insulating layer 107; and
 thinning and planarizing dielectric layer 111 and an upper portion of wires 109R, 109G, and 109B to define a planar upper surface, preferably parallel to the upper surface of substrate 103.

Layer 111 may be made of a material different from the material forming the upper portion of layer 107. The minimum height of layer 111 before thinning and planarization is for example greater than the height of the smallest one of wires 109R, 109G, 109B. Preferably, the minimum height of layer 111 before thinning and planarization is greater than the height of the largest of wires 109R, 109B, and 109G, for example, at least equal to one and a half times the height of the largest of wires 109R, 109B, and 109G.

The thinning and the planarization of layer 111 and of wires 109R, 109G, and 109B are for example performed by chemical-mechanical planarization or CMP. After this step, all wires 109R, 109G, and 109B have substantially the same height, corresponding to the sum of the thicknesses of insulating layers 107 and 111, for example, in the range from 150 nm to 10 µm.

Figure 3:
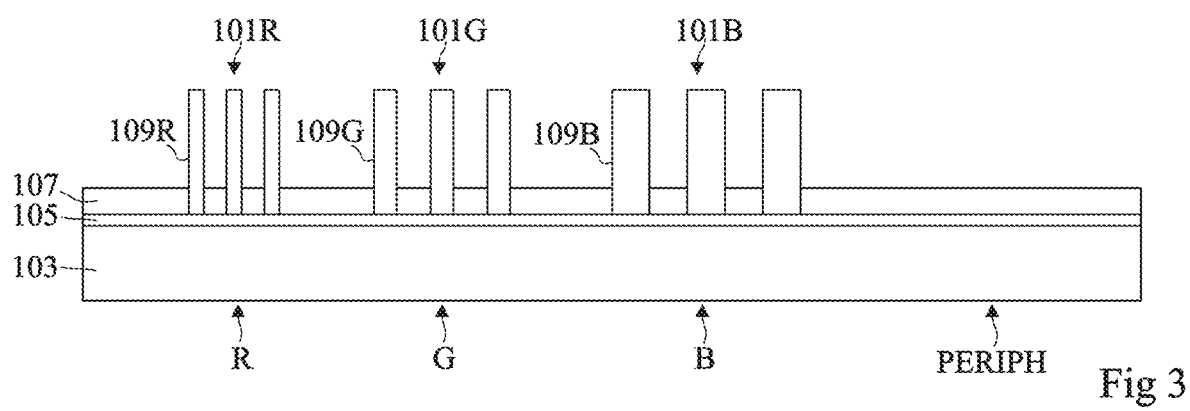
FIG. 3 illustrates another step of the first method.

FIG. 3 shows the structure obtained after having totally removed layer 111 to expose insulating layer 107 and an upper portion of the sides of wires 109R, 109G, 109B. Insulating layer 107 may play the role of a stop layer during the etching of layer 111. The removal of layer 111 may be performed by a wet etching. In the case where layer 111 is made of a polymer material, its removal may be performed by stripping, or also by wet etching. As a variation, the etching of layer 111 may be only partial, a residual layer being kept on insulating layer 107.

As a variation, the steps of FIGS. 2 and 3 may be omitted if wires 109R, 109G, and 109B already have substantially the same height at the end of the steps of FIG. 1.

Figure 4:
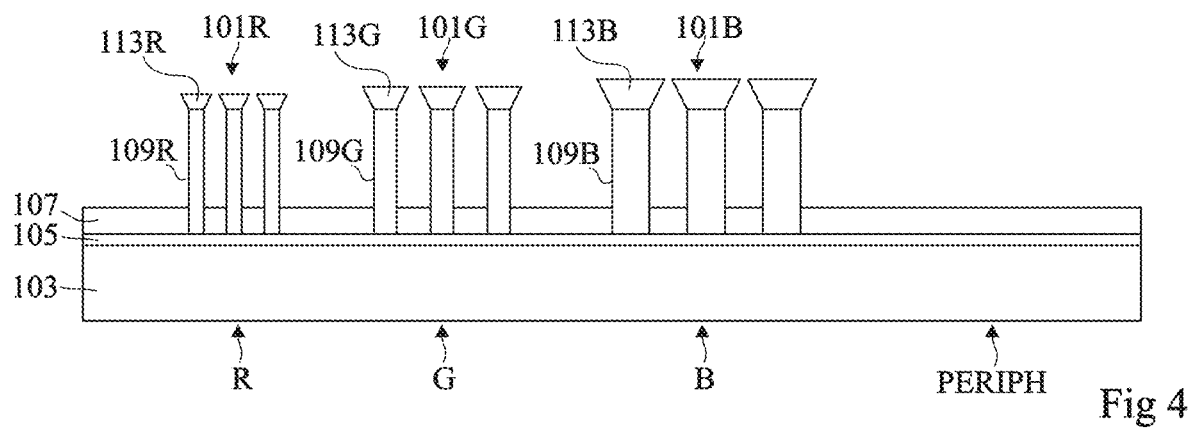
FIG. 4 illustrates another step of the first method.

FIG. 4 shows the structure obtained at the end of a step of simultaneous forming, by epitaxial growth, of heads 113R, respectively 113G, respectively 113B, on top of and in contact with the upper surface of wires 109R, respectively 109G, respectively 109B. Each head 113R, 113G, 113B may comprise a vertical stack (not detailed in the figures) comprising, in the order from the upper surface of the corresponding wire 109R, 109G, or 109B, a lower semiconductor portion of the same material as the wire and doped with a first conductivity type, for example, of type N, an active area, and an upper doped semiconductor portion of the second conductivity type, for example, of type P. A passivation layer, not shown, may be present on the lateral sides of the head.

The assembly formed by each wire 109R, 109G, 109B and the associated head 113R, 113G, 113B forms a wire-shaped elementary LED in axial configuration. Head 113R, 113G, 113B particularly comprises an active area, which is the layer from which most of the electromagnetic radiation delivered by the LED is emitted. As an example, the active area may comprise confinement means, such as multiple quantum wells. The LED is said to be in axial configuration since the PN junction defined between the lower semiconductor portion and the upper semiconductor portion of head 113R, 113G, 113B is a planar junction substantially orthogonal to the central longitudinal axis of semiconductor wire 109R, 109G, 109B.

In the example shown in FIG. 4, the cross-section of each head 113R, 113G, 113B increases as the distance to wire 109R, 109G, 109B increases and the upper semiconductor portions of heads 113R, 113G, 113B of adjacent LEDs are separate. As a variation, the upper semiconductor portions of the heads 113R, 113G, 113B of adjacent LEDs may coalesce. More generally, the heads 113R, 113G, 113B of the LEDs may have other shapes than those shown in FIG. 4, for example, the shapes described in relation with FIGS. 2, 3, 4, 5, 6, and 7 of the above-mentioned patent application WO2019/002786.

The successive layers forming heads 113R, 113G, 113B may be formed by a method similar to that used for the forming of wires 109R, 109G, 109B. The forming of the active areas of heads 113R, 113G, 113B may comprise, in addition to the injection into the reactor of a precursor of a group-III element and of a precursor of a group-V element, a precursor of an additional element, for example, indium. The rate of incorporation of the additional element into the active area particularly depends on the lateral dimensions of the active areas, on the distance between wires. Different indium incorporation rates are thus obtained for the active areas of heads 113R, 113G, and 113B, although they are formed simultaneously. In operation, heads 113R, 113G, and 113B are then capable of emitting electromagnetic radiations at different wavelengths.

Heads 113R, 113G, and 113B are for example formed identically or similarly to what has been described in above-mentioned patent application WO2019/002786.

Figure 5:
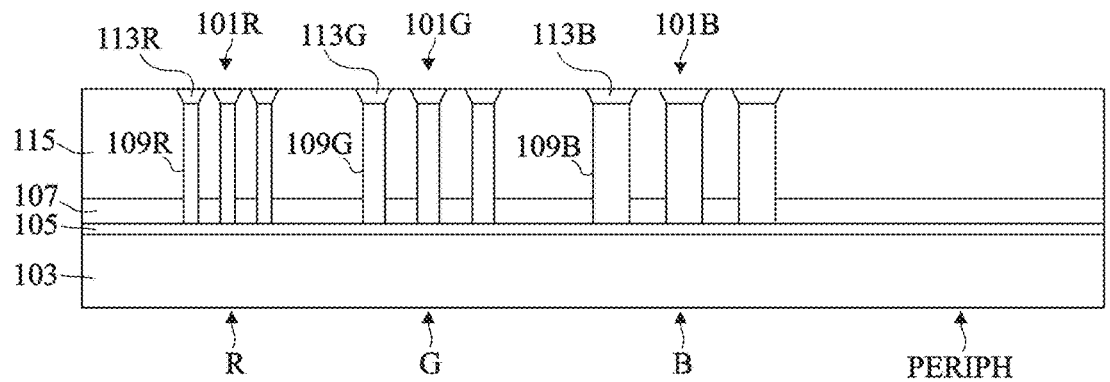
FIG. 5 illustrates another step of the first method.

FIG. 5 shows the structure obtained after the additional successive steps of:
depositing a dielectric or polymer layer 115 all over the upper surface of the structure of FIG. 4, that is, over the elementary LEDs formed by wires 109R, 109G, and 109B and heads 113R, 113G, and 113B, as well as over the upper surface of insulating layer 107; and
thinning and planarizing dielectric layer 115 and an upper portion of heads 113R, 113G, and 113B to define a planar upper surface, preferably parallel to the upper surface of substrate 103.

The minimum height of layer 115 before thinning and planarization is for example greater than the height of the smallest of heads 113R, 113G, 113B. Preferably, the minimum height of layer 115 before thinning and planarization is greater than the height of the tallest of heads 113R, 113G, 113B. The thinning and the planarization of layer 115 and of heads 113R, 113G, 113B are for example performed by CMP. At the end of this step, the upper surfaces of the upper semiconductor portions of heads 113R, 113G, 113B are flush with the upper surface of dielectric layer 115.

Figure 6:
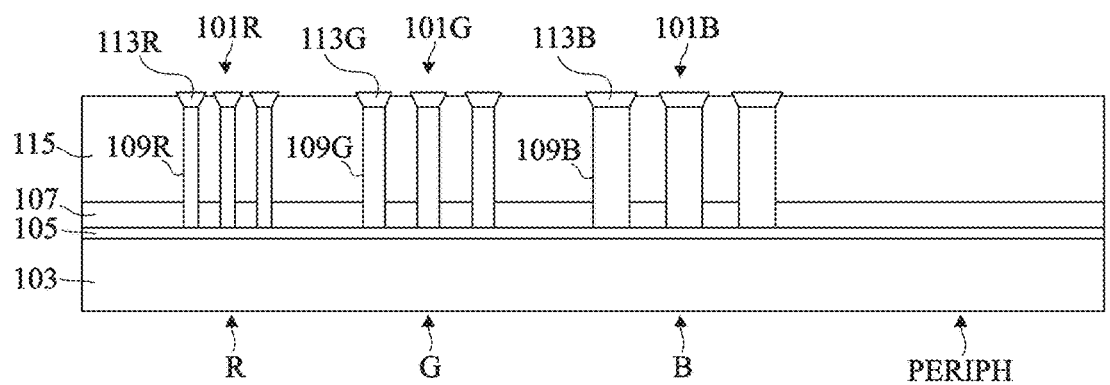
FIG. 6 illustrates another step of the first method.

As a variation, the planarization may stop above the upper surface of heads 113R, 113G, and 113B, the disengaging of the upper surface of the heads being then performed during the additional etch step of FIG. 6.

FIG. 6 shows the structure obtained at the end of an additional step of etching an upper portion of dielectric layer 115. During this step, heads 113R, 113G, and 113B are not etched. This optional step aims at well cleaning the upper surfaces of heads 113R, 113G, and 113B and at disengaging the sides of a portion of the upper semiconductor portion of each head, to take an electric contact on heads 113R, 113G, 113B. The etching is preferably interrupted before reaching the sides of the active areas of heads 113R, 113G, 113B. The etching implemented during this step is for example an etching of reactive ion etching type (RIE) or an inductively coupled plasma etching (ICP).

Figure 7:
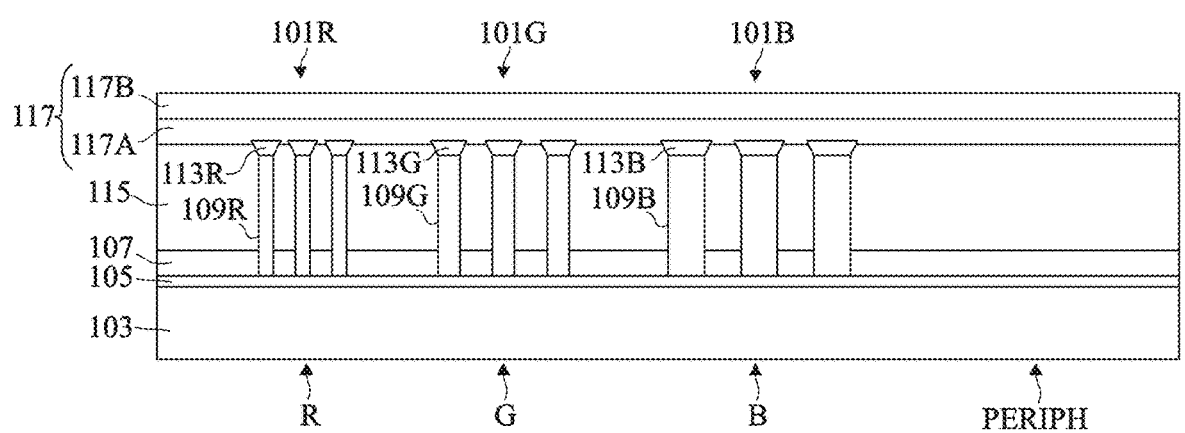
FIG. 7 illustrates another step of the first method.

FIG. 7 shows the structure obtained at the end of an additional step of deposition of an electric contact metal layer 117 on the upper surface of heads 113R, 113G, 113B of the circuit. Layer 117 continuously extends over substantially the entire upper surface of the optoelectronic circuit. Thus, at this stage, all the LEDs of the optoelectronic circuit have their upper semiconductor portions connected to one another by metal layer 117.

Figure 8:
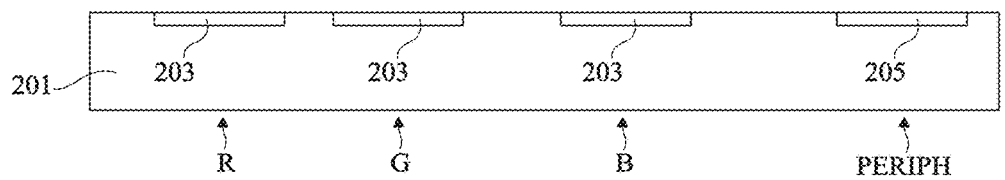
FIG. 8 illustrates another step of the first method.
Figure 9:
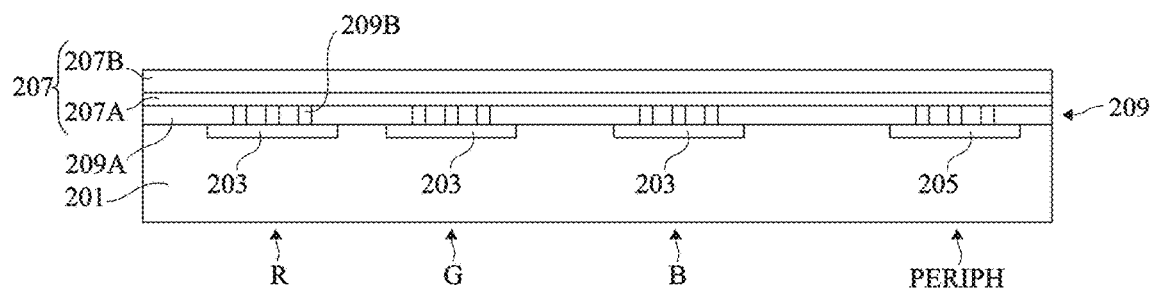
FIG. 9 illustrates another step of the first method.

FIGS. 8 and 9 illustrate successive steps of manufacturing of an active control circuit of the display screen.

FIG. 8 schematically shows an integrated control circuit formed inside and on top of a semiconductor substrate 201, for example, a silicon substrate. In this example, the control circuit comprises, on the side of its upper surface, for each R, G, B pixel of the screen, a metal connection pad 203 intended to be connected to the upper electrodes (in the orientation of FIG. 7) of each of the elementary LEDs of the emission cell 101R, 101G, 101B of the pixel, to be able to control a current flowing through the assembly of elementary LEDs of the cell and/or to apply a voltage across the assembly of LEDs of the cell. The control circuit for example comprises, for each pixel, connected to metal pad 203 of the pixel, an elementary control cell (not detailed in the figures) comprising one or a plurality of transistors, enabling to control the current flowing through the assembly of elementary LEDs of the pixel and/or the voltage applied across the assembly of elementary LEDs of the pixel. The contact with the lower electrodes (in the orientation of FIG. 7) of the elementary LEDs may be taken collectively, for example, in the peripheral region PERIPH of the control circuit, via one or a plurality of metal connection pads 205 identical or similar to metal pads 203. The control circuit is for example manufactured in CMOS technology. Metal pads 203 and 205, for example, made of copper or of aluminum, may be laterally surrounded with an insulating material, for example, silicon oxide, so that the control circuit has a substantially planar upper surface comprising an alternation of metal regions 203, 205 and of insulating regions.

As a variation, metal pads 203 and 205 may be coated with an insulating passivation layer, not shown in FIG. 8, in which case they are not flush with the upper surface side of the circuit.

FIG. 9 illustrates the structure obtained after a step of deposition of a metal layer 207 on the upper surface of the control circuit of FIG. 8. Metal layer 207 continuously extends over substantially the entire surface of the control circuit. In this example, metal layer 207 is electrically in contact with all the metal connection pads 203 and 205 of the control circuit. In the example of FIG. 9, an interconnection structure 209 forms an interface between the upper surface of the structure of FIG. 8 and metal layer 207.

Interconnection structure 209 comprises a dielectric layer 209A continuously deposited over substantially the entire surface of the structure of FIG. 8 and, for each metal connection pad 203, 205 of the control circuit, one or a plurality of conductive vias 209B, for example, made of metal, crossing dielectric layer 209A and coupling the upper surface of metal pad 203, 205 to the lower surface of metal layer 207. Dielectric layer 209A may be either a passivation layer already present at the surface of the circuit and encapsulating metal pads 203 to 205, or a layer transferred to the surface of the circuit in the case where pads 203 and 205 are flush with the upper surface of the circuit. As a variation, interconnection structure 209 may be omitted, metal layer 207 being then directly deposited on top of and in contact with the upper surface of the circuit of FIG. 8.

FIGS. 10 to 16 illustrate successive steps of the forming of the display screen from the optoelectronic circuit of FIG. 7 and the control circuit of FIG. 9.

Figure 10:
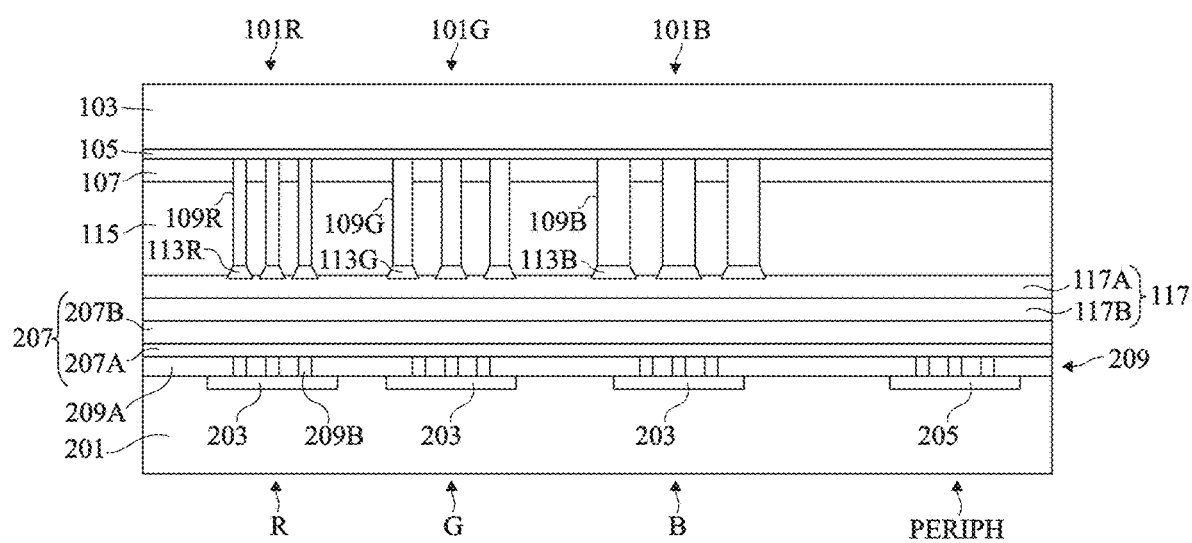
FIG. 10 illustrates another step of the first method.

FIG. 10 illustrates the structure obtained after a step of transfer of the optoelectronic circuit of FIG. 7 on the control circuit of FIG. 9, the metal layer 117 of the optoelectronic circuit facing the metal layer 207 of the control circuit. In FIGS. 10 to 16, the orientation of the optoelectronic circuit is inverted with respect to FIG. 7, while the orientation of the active control circuit is identical to that of FIG. 9.

During the transfer, the optoelectronic circuit is aligned with respect to the active control circuit so that the different emission cells 101R, 101G, 101B of the optoelectronic circuit are arranged opposite different metal connection pads 203 of the active control circuit. For this purpose, the optoelectronic circuit may be aligned on marks (not shown) previously formed on the control circuit, and/or the control circuit may be aligned on marks (not shown) previously formed on the optoelectronic circuit. Prior to the transfer step, the alignment marks may be disengaged, for example, by local removal of metal layer 207 and/or of metal layer 117 opposite the marks. In the shown example, each emission cell 101R, 101G, 101B is located, in vertical projection, opposite a single metal pad 203 of the control circuit.

The optoelectronic circuit is then bonded to the control circuit by direct metal-to-metal bonding of the lower surface (in the orientation of FIGS. 10 to 16) of the metal layer 117 of the optoelectronic circuit to the upper surface of the metal layer 207 of the control circuit. Direct bonding here means a bonding with no addition of matter between the two surfaces to be assembled, for example, a molecular bonding and/or a thermocompression bonding.

An advantage using a direct metal-to-metal bonding (or homogeneous metal-to-metal bonding) to assemble the optoelectronic circuit and the active control circuit is that such a bonding is simpler to implement and requires less preparation steps than a hybrid direct metal-to-metal/dielectric-to-dielectric bonding. This may further enable to form a screen totally deprived of copper.

To provide a proper bonding, metal layer 117 preferably has a lower portion made of the same metal as an upper portion of metal layer 207. Further, metal layer 117 is preferably selected to form a good ohmic contact with the lower semiconductor portions (in the orientation of FIGS. 10 to 16) of the elementary LEDs of the pixels. Metal layer 17 is further preferably reflective for the electromagnetic radiations emitted by the elementary LEDs of the pixels, to increase the emission efficiency and avoid losses of light in the control circuit. The formed screen is indeed intended to emit light from its upper surface (in the orientation of FIG. 10), that is, from its surface opposite to the control circuit. Further, layer 207 and/or layer 117 may be selected to avoid for the metal of connection pads 203, 205 of the control circuit, for example, copper, to diffuse to the lower semiconductor portions of the elementary LEDs of the optoelectronic circuit, which might in particular degrade the quality of the ohmic contact between layer 117 and the elementary LEDs.

In practice, each of layers 207 and 117 may be a single layer or a stack of one or a plurality of layers of different materials enables to ensure all or part of the above-mentioned functions.

As an example, layer 207 comprises an upper layer made of a metal of same nature as a lower layer of layer 117, the metal being selected to obtain a good bonding between the two structures, for example, a metal from the group comprising titanium, nickel, platinum, tin, gold, silver, aluminum, palladium, tungsten, lead, copper, a gold-tin alloy, a titanium-tin alloy, a nickel-tin alloy, or an alloy of all or part of these materials. The stack formed by layers 207 and 117 may further comprise one or a plurality of layers made of metals capable of reflecting the light emitted by the LEDs, for example, silver or aluminum. Further, the stack formed by layers 207 and 117 may comprise one or a plurality of layers capable of forming a barrier against the diffusion of metals such as copper or silver comprised in stack 207/117 and/or in metal pads 203, 205, for example, one or a plurality of layers from the group comprising tantalum nitride, titanium nitride, tungsten nitride, a titanium tungsten alloy, or a combination of all or part of these materials.

In the shown example, layer 117 comprises an upper lower layer 117A made of a material reflective for the electromagnetic radiation emitted by the LEDs and providing a good ohmic contact with the lower semiconductor portions of the LEDs, for example, aluminum or silver (with, possibly, a thin interface layer, for example, made of platinum, nickel, or palladium enabling to ensure a good ohmic contact in the case of P-type gallium nitride) and an upper layer 117B made of a metal capable of ensuring a bonding of good quality with layer 207, for example, titanium. Further, in this example, layer 207 comprises a lower layer 207A made of a metal capable of forming a good electric connection with metal pads 203, 205 (possibly by means of vias 209B), for example, tungsten or copper, and an upper layer 207B made of the same metal as layer 117B.

Figure 11:
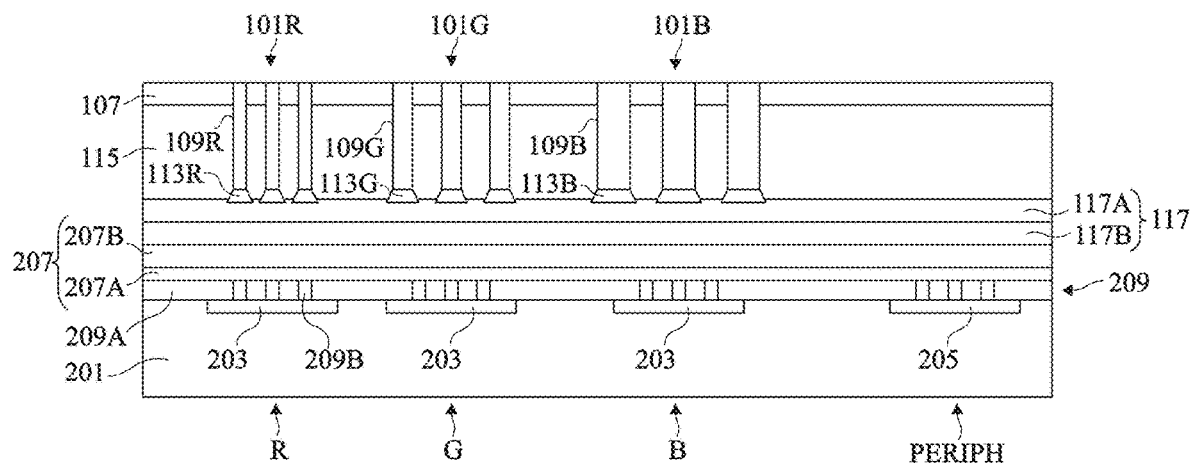
FIG. 11 illustrates another step of the first method.

FIG. 11 illustrates the structure obtained after a step of removing the support substrate 103 and the nucleation layer 105 of the optoelectronic circuit. During this step, the upper surface of dielectric layer 107 and the upper surface of semiconductor wires 109R, 109G, 109B is exposed. Substrate 103 may be removed by grinding and/or wet etching and/or dry etching. Nucleation layer 105 may be removed by wet etching, dry etching, or by CMP. Insulating layer 107 may be used as an etch stop layer during this step.

Figure 12:
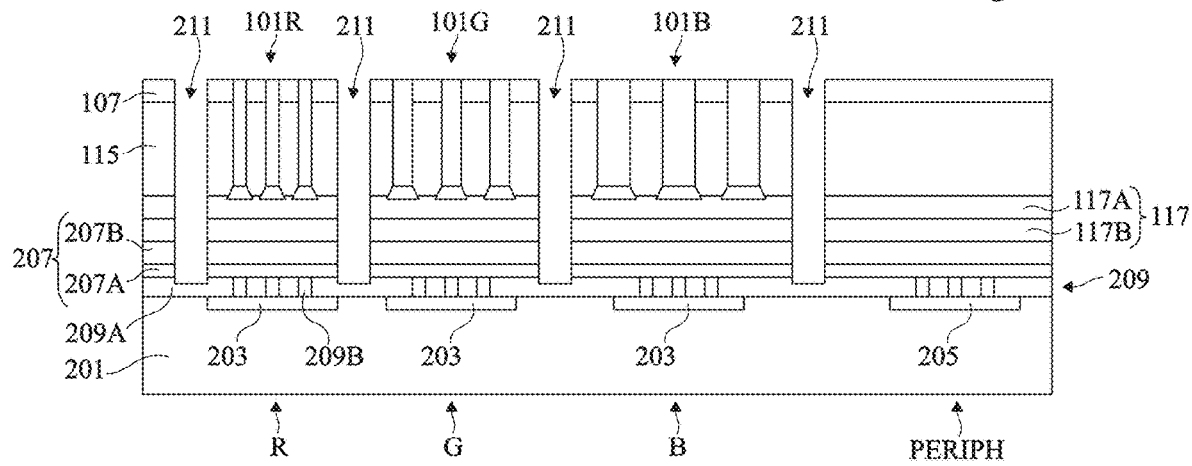
FIG. 12 illustrates another step of the first method.

FIG. 12 illustrates the structure obtained after a step of forming vertical trenches 211 in the structure of FIG. 11, from the upper surface of the structure, for example, by photolithography and etching. Trenches 211 entirely cross dielectric layers 107 and 115 and laterally delimit the emission cells 101R, 101G, 101B of the different pixels of the screen. Each emission cell 101R, 101G, 101B is entirely laterally surrounded with trenches 211, and the adjacent emission cells 101R, 101G, 101B are separated by trenches 211. Trenches 211 further entirely cross metal layers 117 and 207 to electrically insulate the emission cells 101R, 101G, 101B of the different screen pixels from one another. In this example, trenches 211 are located, in vertical projection, opposite the insulating regions laterally separating the connection pads 203, 205 of the control circuit. In the shown example, trenches 211 stop in or on the upper surface of the insulating layer 209A of interconnection structure 209. In the case where interconnection structure 209 is not present, trenches 211 may top in or on the upper surface of the insulating regions laterally separating the metal connection pads 203, 205 of the control circuit.

At the end of the step of forming trenches 211, in each emission cell 101R, 101G, 101B of the screen, each elementary LED of the cell has its lower semiconductor portion, for example, corresponding to its anode region, electrically connected to the underlying metal connection pad 203. The lower semiconductor portions of the elementary LEDs of different emission cells are however electrically insulated by trenches 211. This enables the control circuit to individually control emission cells 101R, 101G, 101B.

Figure 13:
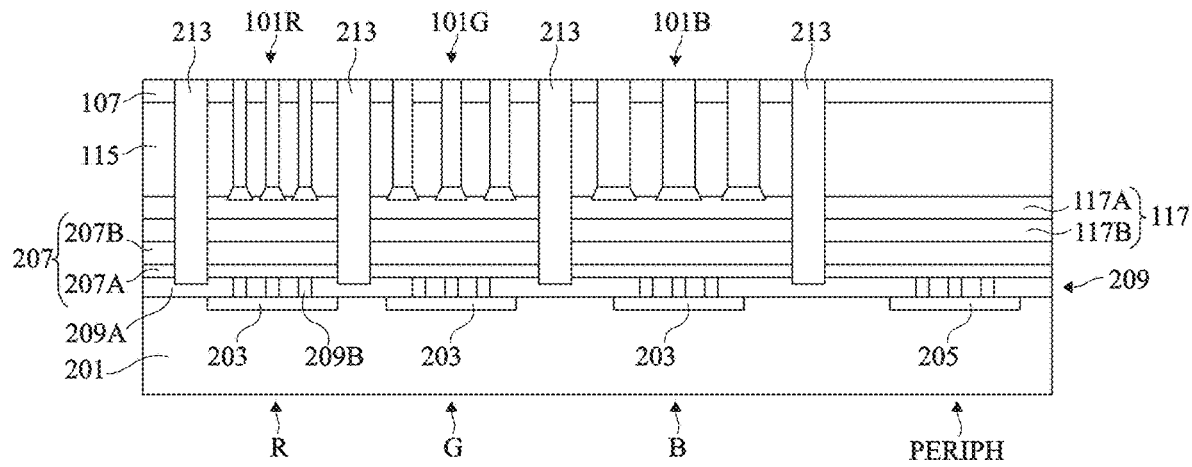
FIG. 13 illustrates another step of the first method.

FIG. 13 illustrates the structure obtained at the end of a subsequent step of filling trenches 211 with an insulating material, for example, silicon oxide, to form insulating walls 213 between the emission cells 101R, 101G, 101B of the different screen pixels. The filling of the trenches may comprise the deposition of a layer of an insulating material all over the upper surface of the structure of FIG. 12, across a thickness sufficiently large to totally fill trenches 211, followed by a step of thinning and of planarization of the insulating layer, for example, by CMP, to define a substantially planar upper surface and to expose the upper surfaces of semiconductor wires 109R, 109G, 109B.

Figure 14:
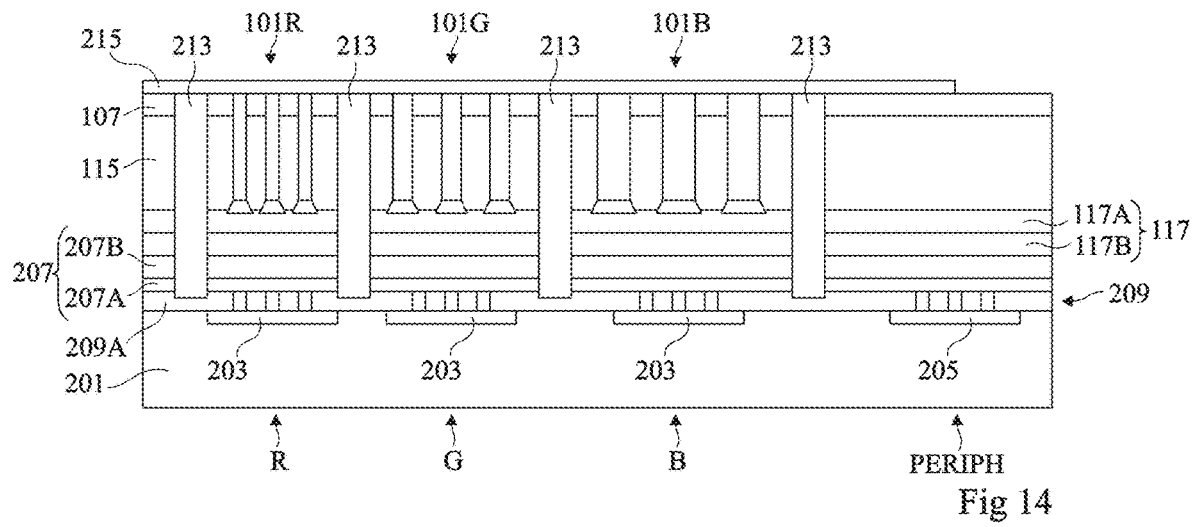
FIG. 14 illustrates another step of the first method.

FIG. 14 illustrates the structure obtained after a step of deposition of a conductive layer 215 on the upper surface of the structure of FIG. 13. Layer 215 is at least partially transparent to the electromagnetic radiations emitted by the elementary LEDs of emission cells 101R, 101G, 101B. At the end of this step, each elementary LED has its semiconductor wire 109R, 109G, 109B for example corresponding to the cathode region of the LED, electrically connected, by its upper surface, to the lower surface of conductive layer 215. Conductive layer 215 thus forms an electrode common to all the elementary emission cells 101R, 101G, 101B of the screen. The material forming conductive layer 215 may be a transparent conductive material such as graphene or a transparent conductive oxide (TCO), for example indium tin oxide (ITO), zinc oxide, doped or not with aluminum, or with gallium, or with boron. As an example, conductive layer 215 has a thickness in the range from 20 nm to 500 nm, preferably from 20 nm to 100 nm. Layer 215 continuously extends over substantially the entire surface of the screen. Layer 215 may however be removed from at least a portion of the surface of the peripheral portion PERIPH of the screen as illustrated in FIG. 14.

Figure 15:
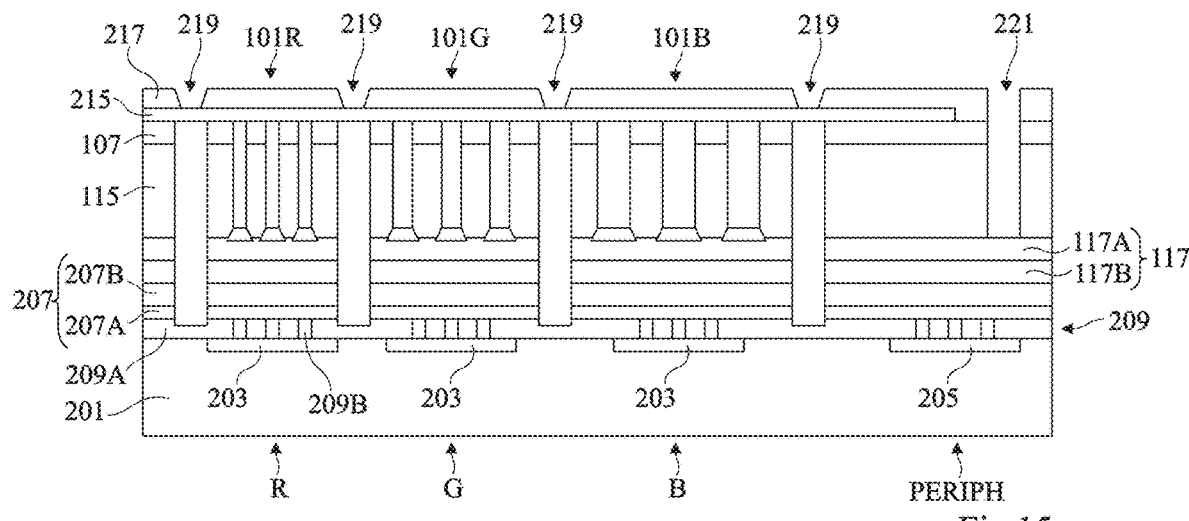
FIG. 15 illustrates another step of the first method.

FIG. 15 illustrates the structure obtained after the steps of:
depositing an insulating layer 217, for example, made of silicon oxide, all over the upper surface of the structure of FIG. 14, that is, over the upper surface of conductive layer 215 and, possibly, over the upper surface of dielectric layer 107 in the peripheral portion PERIPH of the screen;
forming, in layer 217, vertical trenches 219 emerging onto the upper surface of conductive layer 215, trenches 219 being located opposite insulating walls 213 and forming, in top view, a pattern in the form of a continuous gate substantially stacked to lateral insulating walls 213; and
forming, in the peripheral region PERIPH of the screen, from the upper surface of layer 217, one or a plurality of vertical openings 221 emerging onto the upper surface of metal layer 117.

Openings 221 may be formed in a portion of the screen where conductive layer 215 has been removed prior to the deposition of layer 217. In this case, openings 221 only cross insulating layers 217, 107, and 115. As a variation, conductive layer 215 is not removed from the peripheral portion prior to the deposition, in which case openings 221 also cross conductive layer 215.

Openings 219 and 221 are for example formed by photolithography and etching.

Figure 16:
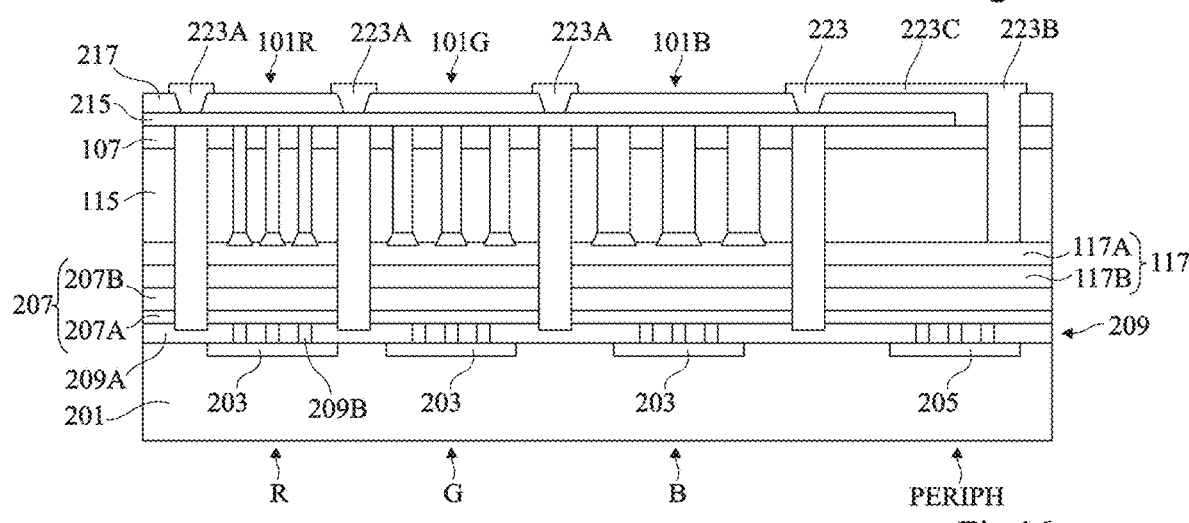
FIG. 16 illustrates another step of the first method.

FIG. 16 illustrates the structure obtained after steps of forming of a metallization 223 formed of:
a continuous metal gate 223A extending in openings 219, in contact with the upper surface of conductive layer 215 at the bottom of openings 219;
one or a plurality of metal vias 223B located in openings 221, in contact with the upper surface of metal layer 117 at the bottom of openings 221; and
one or a plurality of metal tracks 223C extending over the upper surface of layer 217 in the peripheral portion PERIPH of the screen and connecting metal gate 223A to metal vias 223B.

The forming of metallization 223 may comprise a step of deposition of a stack of one or a plurality of metal layers, for example, a stack of Ti/TiN/AlCu type, continuously extending over the entire upper surface of the structure of FIG. 15, followed by a step of local etching of this stack, particularly opposite the emission cells 101R, 101G, 101B of the screen, to only keep metallization 223.

Metallization 223 enables to connect transparent conductive layer 215, forming an electrode common to all the elementary LEDs of the screen, to one or a plurality of connection pads 205 of the control circuit. In the shown example, gate 223A advantageously enables to homogeneously distribute the current over the entire surface of layer 215. As a variation, gate 223A may be omitted, the contact between metallization 223 and the transparent conductive layer being only formed in the peripheral region PERIPH of the screen.

After the forming of metallization 223, an upper passivation layer, not shown, made of an insulating material, may be deposited over the entire upper surface of the screen.

In addition to the advantage of simplifying the manufacturing method due to the use of a direct metal-to-metal bonding during the assembly of the optoelectronic circuit to the active control circuit, an advantage of the screen formed by the method of FIGS. 1 to 16 is that lateral insulating walls 213 may enable to optically separate the emission cells from the different pixels of the screen. The material(s) of lateral insulating walls 213 are for example selected to have a relatively high index contrast, for example, greater than 0.5, with the materials of insulating layers 115 and/or 107, so that walls 213 are reflective for the electromagnetic radiations emitted by the elementary LEDs of the screen.

As an example, the insulating walls may comprise a material having a low refraction index, for example, air or porous silicon oxide. As an example, insulating walls 213 each comprise a thin layer (not detailed in the drawings) of a first dielectric material, for example, titanium oxide ($TiO_2$) or alumina ($Al_2O_3$), coating the lateral walls and the bottom of trench 211, for example, a layer having a thickness in the range from 5 to 50 nm, ensuring the electric insulation, and a core (or central wall) of a second dielectric material with a relatively low refraction index, for example, air, or porous silicon oxide, filling the rest of trench 211.

The material of layer 115, having the three-dimensional elementary LEDs encapsulated therein, may be a material having a relatively high refraction index, for example, titanium oxide (TiO$_2$) deposited by a sol-gel method, for example such as described in the article entitled "Multifunctional Metasurfaces Based on Direct Nanoimprint of Titania Sol-Gel Coatings" of Simona Checcucci et al. (Adv. Optical Mater. 2019, 1801406, 2019).

An etch slope may further be provided on forming of trenches 211, to favor the reflection towards the inside of each emission cell, light emitted by the elementary LEDs propagating in the material of layer 115 towards neighboring cells. As an example, the lateral walls of trenches 211 may be substantially planar, and inclined with respect to the vertical direction so that the width of trenches 211 decreases from the bottom (or base) to the opening (or top) of trenches 211 (in the orientation of FIG. 12). As a example, the inclination angle of the lateral walls of trenches 211 (and thus of walls 213) is selected according to the respective refraction indexes of layer 115 and of the filling material of walls 213, so that a ray emitted by a three-dimensional elementary LED, propagating in the material of layer 115 inside of an emission cell, according to a direction orthogonal to the mean plane of the insulating wall 213 separating the cell from a neighboring cell, is reflected by total reflection on the interface between layer 115 and the filling material of wall 213. As an example, in the case where layer 115 is made of silicon oxide (optical index in the order of 1.46) and where wall 213 comprises an air core (optical index equal to 1), the inclination angle of the side of walls 213 may be in the order of 40 degrees. In the case where layer 115 is made of titanium oxide formed by a sol-gel method (optical index in the order of 2.3) and where wall 213 comprises an air core (optical index equal to 1), the inclination angle of the sides of walls 213 may be in the order of 25 degrees.

The upper surface (or output surface) of layer 115 may have surface unevennesses (not shown in the drawings) forming a grating area enabling to avoid a phenomenon of total reflection of the light coming from the outside of layer 115 and thus favor the extraction of the light emitted by the three-dimensional LEDs.

As a variation, the lateral walls and the bottom of trenches 211 may be coated with an alternation of first layers of a first transparent dielectric material having a first refraction index and of second layers of a second transparent dielectric material having a second refraction index, said alternation of layers forming a reflector on the trench sides. The second material preferably has a relatively high index contrast, for example, greater than 0.5, with the first material. The first and second layers may be relatively thin, for example, with thicknesses in the range from 10 to 100 nm. The number of alternations of layers is for example in the range from 1 to 5. As an example, the first layers are made of titanium oxide, for example, having a thickness in the order of 50 nm, and the second layers are made of silicon oxide, for example, having a thickness in the order of 84 nm. As a variation, the first layers are made of alumina, for example, having a thickness in the order of 70 nm, and the second layers are made of silicon oxide, for example, having a thickness in the order of 84 nm. The rest of trench 211 may be filled with air or with porous silicon oxide.

In another variation, each vertical insulating wall 213 may comprise an insulating layer (not detailed in the figure), for example, made of titanium oxide or of alumina, coating the lateral walls and the bottom of trench 211, and a reflective central metal wall (not detailed in the figure), for example, made of aluminum or of tungsten, filling the rest of the trench.

To further improve the optical separation, a combination of a multilayer dielectric mirror and of a metal mirror may be provided. As an example, the lateral walls and the bottom of trenches 211 may be coated with an alternation of first and second dielectric layers having different indexes, as described hereabove, the rest of the trench being filled with a reflective central metal wall. The number of alternations of dielectric layers is for example in the range from 1 to 3. As an example, the first layers are made of titanium oxide, for example, having a thickness in the order of 44 nm, and the second layers are made of silicon oxide, for example, having a thickness in the order of 74 nm. As a variation, the first layers are made of alumina, for example, having a thickness in the order of 62 nm, and the second layers are made of silicon oxide, for example, having a thickness in the order of 75 nm. The central metal layer may be made of aluminum or of tungsten, for example, having a thickness greater than 50 nm.

Figure 17:
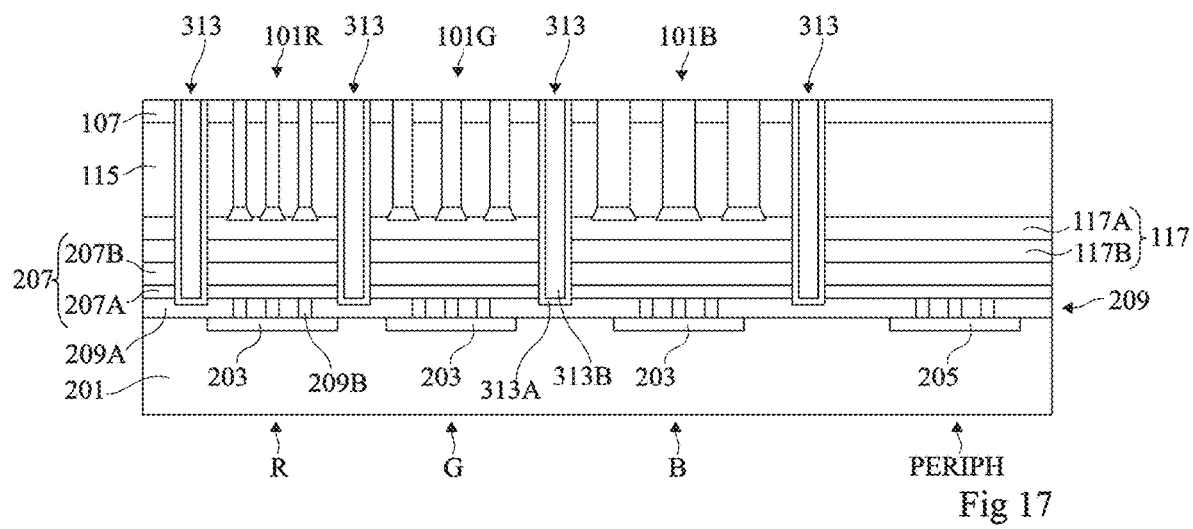
FIG. 17 illustrates a step of a second method of manufacturing an emissive display comprising LEDs according to an embodiment.
Figure 18:
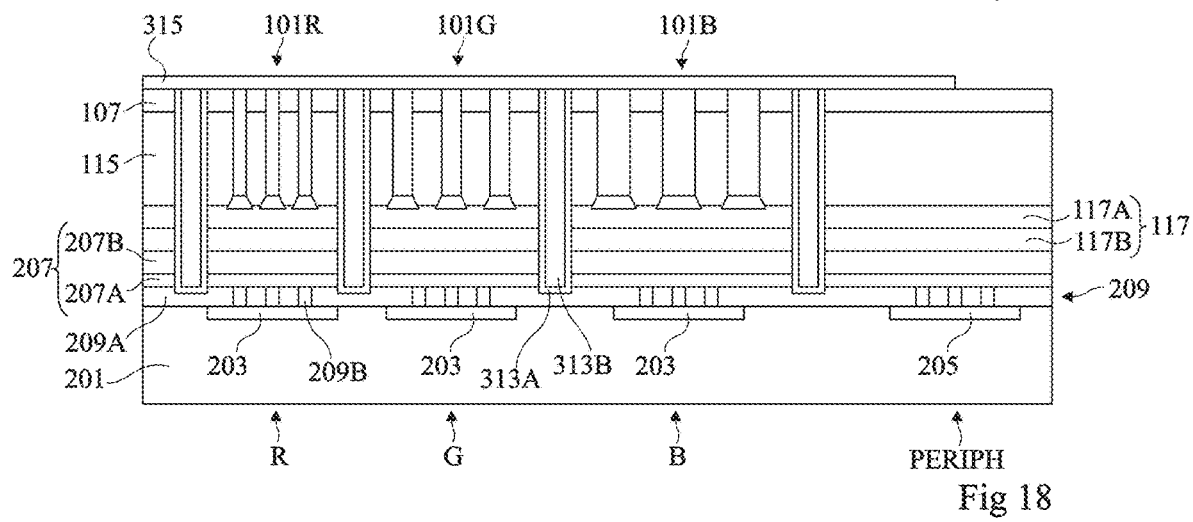
FIG. 18 illustrates another step of the second method.
Figure 19:
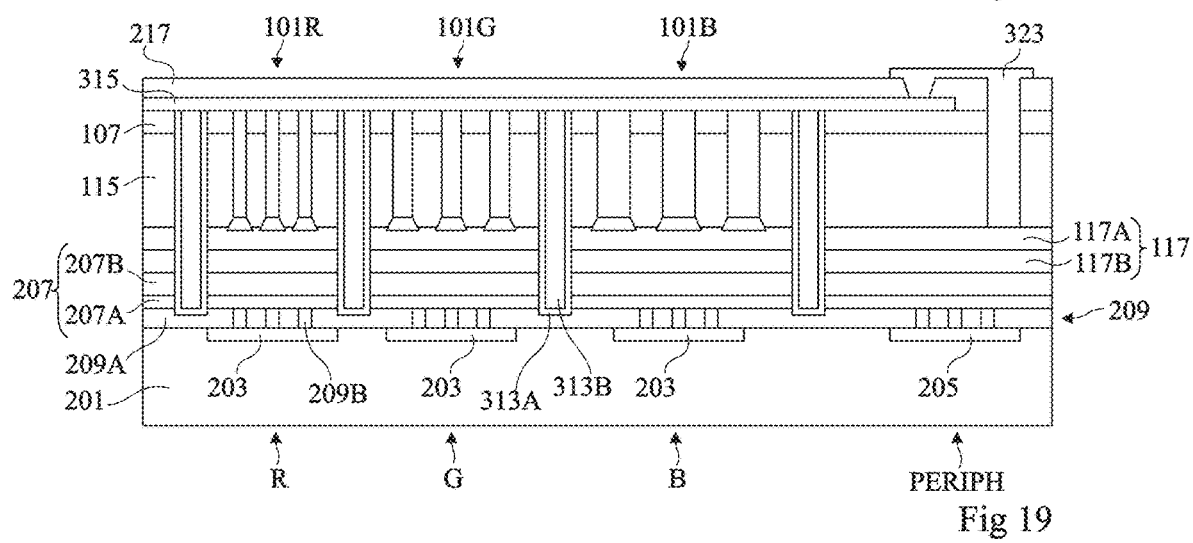
FIG. 19 illustrates another step of the second method.

FIGS. 17 to 19 are partial simplified cross-section views of the structures obtained at steps of a variant of the method of manufacturing an emissive display comprising LEDs described in relation with FIGS. 1 to 16. Such a variant comprises initial steps identical to what has been previously described in relation with FIGS. 1 to 12.

FIG. 17 illustrates the structure obtained after steps of forming insulated conductive walls 313 in the trenches 211 of the structure of FIG. 12. The forming of the insulated conductive walls may comprise the successive steps of:

depositing, by a conformal deposition method, an insulating layer 313A, for example, made of silicon oxide, over the entire upper surface of the structure of FIG. 12, that is, on the lateral walls and at the bottom of trenches 211, as well as on the upper surface of dielectric layer 107 and of semiconductor wires 109R, 109G, 109B, and insulating layer 313A does not totally fill trenches 211; —depositing a metal layer 313B all over the upper surface of the structure across a thickness sufficient to totally fill trenches 211; and thinning and planarizing the upper surface of the structure, for example, by CMP, to obtain a substantially planar surface and to only keep insulating layer 313A and metal layer 313B in trenches 211.

FIG. 18 illustrates the structure obtained after a step of deposition of a transparent conductive layer 315, identical or similar to the layer 215 of FIG. 14, on the upper surface of the structure of FIG. 17. In this variant, conductive layer 315 is in contact, by its lower surface, not only with the semiconductor wires 109R, 109G, 109B of the elementary LEDs, but also with the conductive walls 313B of lateral insulating walls 313.

FIG. 19 illustrates the structure obtained after the successive steps of:

depositing an insulating layer 217, for example, made of silicon oxide, over the entire upper surface of the structure of FIG. 18; and forming, inside and on top of layer 217 and in dielectric layers 107 and 115, a metallization 323 connecting the upper surface of conductive layer 315 to the upper surface of a peripheral portion of metal layer 117.

In this variation, metallization 323 is entirely located in the peripheral portion PERIPH of the screen. The conductive walls 313B of lateral insulating walls 313 form a continuous conductive structure in contact with the lower surface of transparent conductive layer 315, providing a homogeneous distribution of the current in layer 315.

Metallization 323 may be formed by a method identical or similar to the method of forming metallization 223 described in relation with FIGS. 15 and 16.

After the forming of metallization 323, an upper passivation layer, not shown, made of an insulating material, may be deposited all over the upper surface of the screen.

An advantage of the variant of FIGS. 17 to 19 is that it enables to limit, or even to suppress, the masking of transparent conductive layer 315 by the metallization of connection of this layer to the control circuit. Further, the metal walls 313B of lateral insulating walls 313 enable to reinforce the optical separation between the emission cells of the different pixels and/or to improve the dissipation of the heat generated in the pixels during the screen operation.

Various embodiments and variants have been described. Those skilled in the art will understand that certain features of these embodiments can be combined and other variants will readily occur to those skilled in the art. In particular, the described embodiments are not limited to the examples of dimensions and of materials mentioned in the present disclosure.

Further, as a variation, at the step of FIG. 4, the heads 113R, 113G, 113B of the elementary LEDs of the different types of pixels are not formed simultaneously on wires 109R, 109G, 109B, but sequentially, with three separate growth steps during which the wires at the top of which heads should not be formed are masked. Wires 109R, 109G, 109B may then all have the same diameter and the same pitch between wires, the active areas of heads 113R, 113G, 113B being formed with different compositions, for example, with different proportions of indium, to obtain emissions at different wavelengths.

Further, although only embodiments where the three-dimensional elementary LEDs of the emission cells of the pixels are semiconductor nanowires or microwires in axial configuration have been described hereabove, the described embodiments are not limited to this specific case. As a variation, the three-dimensional elementary LEDs of the pixels may be pyramidal nanostructures or microstructures in radial configuration, of core-shell type, for example, such as defined in the above-mentioned patent application WO2019/002786, the upper electric contact (via conductive layer 215 or 315) being then formed on the tip of the pyramids.

Further, although only embodiments where the emission cells of the pixels each comprise one or a plurality of three-dimensional elementary cells have been described hereabove, as a variation, the screen may combine pixels having their emission cells each comprising one or a plurality of elementary three-dimensional LEDs, as described hereabove, and pixels having their emission cells each comprising a single planar LED formed of a stack of substantially planar semiconductor layers continuously extending over the entire surface of the cell.

The invention claimed is:

1. A method of manufacturing an emissive screen comprising LEDs, comprising the steps of:
   a) depositing a first metal layer on a surface of a control circuit comprising a plurality of metal connection pads;
   b) depositing a second metal layer on a surface of an optoelectronic circuit comprising first emission cells capable of emitting an electromagnetic radiation at a first wavelength and defining pixels of a first color and second emission cells capable of emitting an electromagnetic radiation at a second wavelength different from the first wavelength and defining pixels of a second color different from the first color; each first emission cell comprising one of a plurality of LEDs, each formed of a three-dimensional semiconductor element;
   c) bonding the optoelectronic circuit to the control circuit by direct bonding of the second metal layer to the first metal layer, by aligning the optoelectronic circuit with respect to the control circuit so that the different emission cells of the optoelectronic circuit are arranged opposite different metal connection pads of the control circuit, wherein, at step c), the first metal layer extends all over the surface of the control circuit and is electrically connected to the metal connection pads of the control circuit, and the second metal layer extends all over the surface of the optoelectronic circuit and is electrically connected to a first end of each three-dimensional semiconductor element of the optoelectronic circuit; and
   d) forming, from the surface of the optoelectronic circuit opposite to the control circuit, trenches laterally delimiting each emission cell of the optoelectronic circuit, the trenches crossing the second and first metal layers so that the different emission cells are connected to different metal connection pads of the control circuit.

2. The method according to claim 1, wherein each second emission cell comprises one or a plurality of LEDs, each formed of a three-dimensional semiconductor element.

3. The method according to claim 1, wherein the second metal layer comprises at least one layer reflective for the electromagnetic radiations emitted by the first and second emission cells.

4. The method according to claim 3, wherein said reflective layer comprises silver or aluminum.

5. The method according to any of claim 1, wherein the first metal layer comprises a metal bonding layer in contact with a metal bonding layer of the second metal layer, the metal bonding layers of the first and second metal layers being made of the same material.

6. The method according to claim 5, wherein the metal bonding layers of the first and second metal layers are made of Ti, Ni, Pt, Sn, Au, Ag, Al, Pd, W, Pb, Cu, AuSn, TiSn, NiSn, or of an alloy of all or part of these materials.

7. The method according to any of claim 1, further comprising the forming of lateral insulating walls in the trenches.

8. The method according to claim 7, wherein the lateral insulating walls are made of an electrically-insulating material.

9. The method according to claim 7, wherein the lateral insulating walls comprise an insulating layer coating the lateral walls and the bottom of the trenches, and a central conductive wall.

10. The method according to claim 9, wherein the central conductive wall is made of a reflective material, for example, aluminum or tungsten.

11. The method according to any of claim 1, wherein:
   the trenches have inclined lateral walls, and/or;
   a reflector formed of an alternation of dielectric layers of different refraction indexes is formed on the lateral walls of the trenches.

12. The method according to any of claim 1, further comprising a step of deposition of a transparent conductive layer on the surface of the optoelectronic circuit opposite to the control circuit, the transparent conductive layer being in contact with a second end of each three-dimensional semiconductor element of the optoelectronic circuit and forming an electrode common to all the emission cells of the optoelectronic circuit.

13. The method according to claim 12, wherein the transparent conductive layer is made of graphene or of a transparent conductive oxide.

14. The method according to claim 12, further comprising the forming of a metallization electrically connecting the transparent conductive layer to one or a plurality of connection pads of the control circuit.

15. The method according to claim 12, further comprising forming of lateral insulating walls in the trenches, wherein the lateral insulating, and wherein the transparent conductive layer is in contact, by its lower surface, with the upper surface of the central conductive walls of the lateral insulating walls.

16. The method according to any of claim 1, wherein the optoelectronic circuit further comprises third emission cells capable of emitting an electromagnetic radiation at a third wavelength different from the first and second wavelengths.

17. An emissive screen comprising LEDs, comprising:
a control circuit having a surface comprising a plurality of metal connection pads;
an optoelectronic circuit comprising first emission cells capable of emitting an electromagnetic radiation at a first wavelength and defining pixels of a first color and second emission cells capable of emitting an electromagnetic radiation at a second wavelength different from the first wavelength and defining pixels of a second color different from the first color, each first emission cell comprising one of a plurality of LEDs, each formed of a three-dimensional semiconductor element;
wherein the optoelectronic circuit is bonded to the control circuit by direct bonding of the second metal layer to the first metal layer, so that the different emission cells of the optoelectronic circuit are arranged opposite different metal connection pads of the control circuit, wherein, the first metal layer extends all over the surface of the control circuit and is electrically connected to the metal connection pads of the control cirucit, and the second metal layer extends all over the surface of the optoelectronic cirucit and is electrically connected to a first end of each three-dimensional semiconductor element of the optoelectronic circuit; and wherein the screen comprises a plurality of trenches formed from the surface of the optoelectronic circuit opposite to the control circuit, the trenches laterally delimiting each emission cell of the optoelectronic circuit, the trenches crossing the second and first metal layers so that the different elementary emission cells are connected to different metal connection pads of the control circuit.

* * * * *